United States Patent
Han et al.

(10) Patent No.: US 11,586,079 B2
(45) Date of Patent: Feb. 21, 2023

(54) FILM TYPE PACKAGE COMPRISING A PLURALITY OF TEST LINES AND A PLURALITY OF FIRST AND SECOND CONNECTION PADS AND DISPLAY APPARATUS HAVING THE SAME

(71) Applicant: SAMSUNG ELECTRONICS CO., LTD., Suwon-si (KR)

(72) Inventors: Byung Hun Han, Hwaseong-si (KR); Jung Eun Koo, Hwaseong-si (KR); So Young Lim, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/559,590

(22) Filed: Dec. 22, 2021

(65) Prior Publication Data
US 2022/0113577 A1    Apr. 14, 2022

Related U.S. Application Data

(62) Division of application No. 16/254,026, filed on Jan. 22, 2019, now Pat. No. 11,231,626.

(30) Foreign Application Priority Data

Jun. 1, 2018   (KR) .......................... 10-2018-0063712

(51) Int. Cl.
*G02F 1/1345*   (2006.01)
*H01L 23/31*    (2006.01)
(Continued)

(52) U.S. Cl.
CPC ...... *G02F 1/13452* (2013.01); *H01L 23/3107* (2013.01); *H01L 24/29* (2013.01);
(Continued)

(58) Field of Classification Search
CPC .. H01L 2924/1426; H05K 2201/09409; H05K 2201/10681
See application file for complete search history.

(56) References Cited

U.S. PATENT DOCUMENTS 6,495,768 B1   12/2002   Cho
6,853,090 B2   2/2005    Kim et al.
(Continued)

FOREIGN PATENT DOCUMENTS

JP   10079400 A   *  3/1998   ............. H01L 23/32
JP   10079400 A      3/1998
(Continued)

*Primary Examiner* — Paul C Lee
(74) *Attorney, Agent, or Firm* — Sughrue Mion, PLLC

(57) ABSTRACT

A film type package includes: a base film having first and second sides; a driver integrated circuit mounted on the base film; first connection pads disposed on a first area of the base film that is adjacent to the first side of the base film, and configured to be connected to a first external circuit; second connection pads disposed on a second area of the base film that is adjacent to the second side of the base film, and configured to be connected to a second external circuit; first signal lines disposed on the base film, and connecting the driver integrated circuit and the first connection pads; second signal lines disposed on the base film, and connecting the driver integrated circuit and the second connection pads; and a plurality of test lines extending from the driver integrated circuit to the first side of the base film.

8 Claims, 8 Drawing Sheets

(51) Int. Cl.
*H05K 1/02* (2006.01)
*H01L 27/32* (2006.01)
*H05K 1/18* (2006.01)
*H01L 23/00* (2006.01)

(52) U.S. Cl.
CPC ....... *H01L 27/3276* (2013.01); *H05K 1/0268* (2013.01); *H05K 1/185* (2013.01); *H05K 2201/10681* (2013.01)

(56) References Cited

U.S. PATENT DOCUMENTS

| | | | |
|---|---|---|---|
| 7,414,323 B2 | 8/2008 | Hirae | |
| 7,876,122 B2 | 1/2011 | Noumi et al. | |
| 2005/0186702 A1 | 8/2005 | Saimen | |
| 2006/0181299 A1* | 8/2006 | Hirae | H01L 23/4985 |
| | | | 324/762.04 |
| 2007/0216846 A1* | 9/2007 | Tseng | G02F 1/13452 |
| | | | 349/149 |
| 2007/0235888 A1* | 10/2007 | Her | H01L 22/32 |
| | | | 257/784 |
| 2009/0153791 A1 | 6/2009 | Chang et al. | |
| 2011/0292313 A1 | 12/2011 | Takenaka | |
| 2017/0196080 A1 | 7/2017 | Meng et al. | |
| 2017/0358520 A1 | 12/2017 | Song et al. | |
| 2018/0027651 A1 | 1/2018 | Lim et al. | |

FOREIGN PATENT DOCUMENTS

| | | | | |
|---|---|---|---|---|
| JP | 10256713 A | * | 9/1998 | ........... B23K 1/0016 |
| JP | H10256713 A | | 9/1998 | |
| JP | 2000077482 A | * | 3/2000 | ............. H05K 1/118 |
| JP | 2000077482 A | | 3/2000 | |
| JP | 2004062201 A | * | 2/2004 | ........... G02F 1/1345 |
| JP | 2004062201 A | | 2/2004 | |
| JP | 2011-249527 A | | 12/2011 | |
| JP | 2016-207792 A | | 12/2016 | |
| KR | 10-2017-0140481 A | | 12/2017 | |
| KR | 10-2018-0010890 A | | 1/2018 | |

* cited by examiner

FILM TYPE PACKAGE COMPRISING A PLURALITY OF TEST LINES AND A PLURALITY OF FIRST AND SECOND CONNECTION PADS AND DISPLAY APPARATUS HAVING THE SAME

CROSS-REFERENCE TO RELATED APPLICATION

This application is a divisional of U.S. application Ser. No. 16/254,026 filed on Jan. 22, 2019, which claims benefit of priority to Korean Patent Application No. 10-2018-0063712 filed on Jun. 1, 2018 in the Korean Intellectual Property Office, the disclosure of all of the above are incorporated herein by reference in their entirety.

BACKGROUND

1. Field

The present disclosure relates to a film type package and a display apparatus having the same.

2. Description of Related Art

In a display apparatus, a driver integrated circuit such as a data driver or a gate driver may be provided in a film type package such as a chip-on-film (COF) package. The film type package may be configured to be electrically connected to a printed circuit board (PCB) and a display panel through a connection pad, to input and output signals.

In such a film type package, an input outer lead bonding (OLB) to be connected to the PCB may be probed using various types of test pins, to solve a problem regarding non-selection in a final shipment inspection.

In a situation in which a display apparatus is miniaturized, an OLB area itself required for a display module is decreased. Therefore, it may be necessary to reduce the OLB area for testing, without lowering the test screening ability.

SUMMARY

One or more example embodiments provide a film type package capable of significantly reducing an OLB area for IC testing in view of assembly of display modules, without lowering the test screening ability applied at the time of shipment.

According to an aspect of an example embodiment, there is provided a film type package including: a base film having a plurality of package areas arranged in a longitudinal direction of the base film, and a plurality of margin areas located between the plurality of package areas; a plurality of package units disposed on the plurality of package areas, respectively; and a plurality of test pads disposed on each of the plurality of margin areas, the plurality of test pads being adjacent to a first side of each of the plurality of package areas of the base film, wherein each of the plurality of package units includes: a driver integrated circuit mounted in a corresponding package area of the plurality of package areas; a plurality of first connection pads disposed adjacent to the first side of the corresponding package area; a plurality of second connection pads disposed adjacent to a second side of the corresponding package area, the second side being opposite to the first side; a plurality of first signal lines disposed on the corresponding package area, and connecting the driver integrated circuit and the plurality of first connection pads; a plurality of second signal lines disposed on the corresponding package area, and connecting the driver integrated circuit and the plurality of second connection pads; and a plurality of test lines connecting the driver integrated circuit and the plurality of test pads.

According to an aspect of an example embodiment, there is provided a film type package including: a base film having a first side and a second side that is opposite to the first side; a driver integrated circuit mounted on the base film; a plurality of first connection pads disposed on a first area of the base film that is adjacent to the first side of the base film, and configured to be connected to a first external circuit; a plurality of second connection pads disposed on a second area of the base film that is adjacent to the second side of the base film, and configured to be connected to a second external circuit; a plurality of first signal lines disposed on the base film, and connecting the driver integrated circuit and the plurality of first connection pads; a plurality of second signal lines disposed on the base film, and connecting the driver integrated circuit and the plurality of second connection pads; and a plurality of test lines extending from the driver integrated circuit to the first side of the base film.

According to an aspect of an example embodiment, there is provided a display apparatus including: at least one film type package including a base film having a first side and a second side that is opposite the first side; a printed circuit board connected to the at least one film type package at the first side of the base film; and a display panel connected to the at least one film type package at the second side of the base film, wherein the at least one film type package includes: a driver integrated circuit mounted on the base film; a plurality of first connection pads disposed on a first area of the base film that is adjacent to the first side of the base film, and configured to be connected to the printed circuit board; a plurality of second connection pads disposed on a second area of the base film that is adjacent to the second side of the base film, and configured to be connected to the display panel; a plurality of first signal lines disposed on the base film, and connecting the driver integrated circuit and the plurality of first connection pads; a plurality of second signal lines disposed on the base film, and connecting the driver integrated circuit and the plurality of second connection pads; and a plurality of test lines extending from the driver integrated circuit to the first side of the base film, each of the plurality of test lines having a width Wb that is narrower than a width W1 of each of the plurality of first connection pads.

BRIEF DESCRIPTION OF DRAWINGS

The above and other aspects, features, and advantages will be more clearly understood from the following detailed description of example embodiments, taken in conjunction with the accompanying drawings, in which.

DETAILED DESCRIPTION

Hereinafter, example embodiments will be described with reference to the accompanying drawings.

Figure 1:
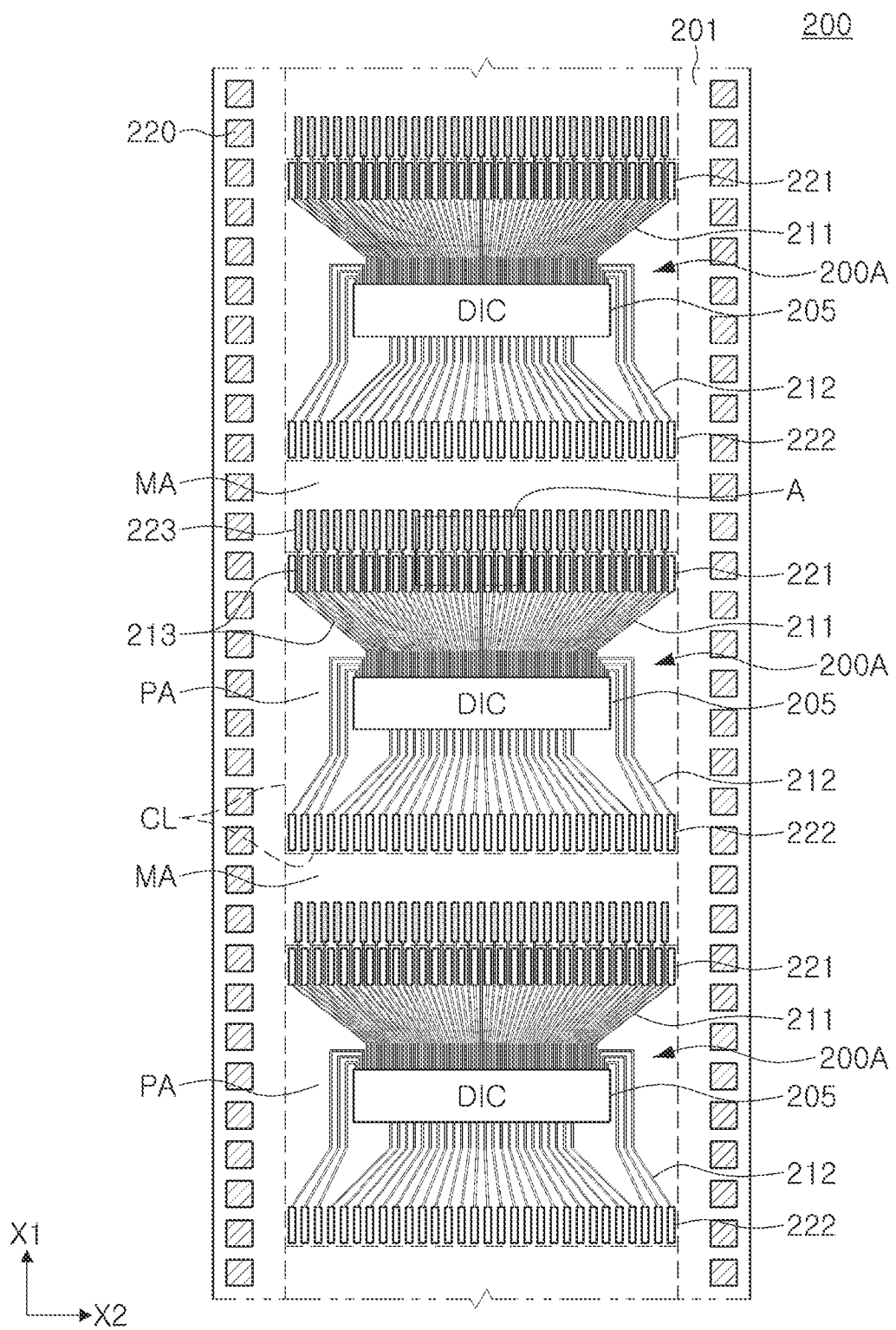
FIG. 1 is a plan view of a film type package according to an example embodiment.
Figure 2:
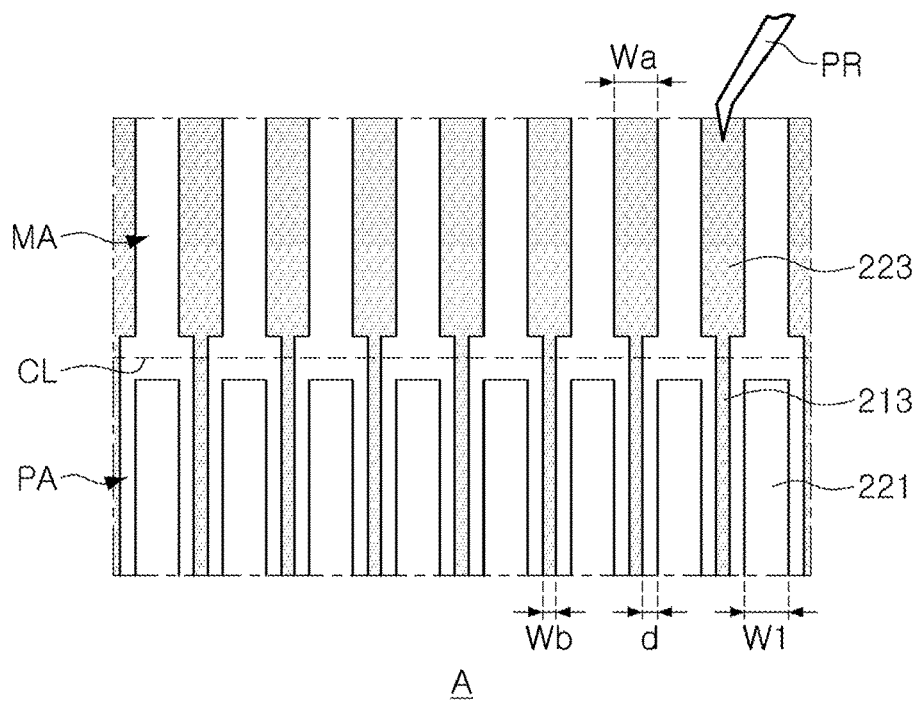
FIG. 2 is an enlarged plan view of an area A of a film type package illustrated in FIG. 1.

FIG. 1 is a plan view of a film type package according to an example embodiment, and FIG. 2 is an enlarged plan view of an area A of a film type package illustrated in FIG. 1.

Referring to FIG. 1, a film type package 200 according to an example embodiment may include a base film 201 including a plurality of package areas PA and a plurality of margin areas MA located between the plurality of package areas PA, and a plurality of package units 200A disposed on the plurality of package areas PA.

The film type package 200 according to the present example embodiment can be understood as a reel type including a plurality of package units disposed in a first direction (X1, i.e., a longitudinal direction). The plurality of package units 200A may be provided as a separate film type package, which is separated along a cutting line CL, and used for a module assembly. In this specification, the package unit 200A may be referred to as "a film type package."

In the present example embodiment, the plurality of package units 200A may include a driver integrated circuit DIC 205, a plurality of first connection pads 221 disposed on one side of each of the package area PA, and a plurality of second connection pads 222 disposed on the other side of each of the package area PA. Each of the package units PA may include a plurality of first signal lines 211 connecting the driver integrated circuit 205 and the plurality of first connection pads 221, respectively, and a plurality of second signal lines 212 connecting the driver integrated circuit 205 and the plurality of second connection pads 222, respectively.

The driver integrated circuit 205 may be a display driver IC (DDI) chip, and may be mounted in a package area. The first and second connection pads 221 and 222 may be disposed on opposing sides of the DIC 205 in each of the package areas PA. For example, an area of the one side arranged on the first connection pad 221 may be an area of an outer lead bonding (OLB) connected to the printed circuit board, and an area of the other side arranged on the second connection pad 222 may be an area of an inner lead bonding (ILB) connected to the display panel (see FIG. 6).

The plurality of first signal lines 211 and the plurality of second signal lines 212 are connected to the driver integrated circuit 205 to receive signals from external circuits (e.g., a printed circuit board and a display panel), or output signals to external circuits. The first and second connection pads 221 and 222 may have a width wider than a width of the first and second signal lines 211 and 212 to secure a contact area.

A Design For Test (DFT) process for designing a test circuit for inspection process in the design stage may be performed to improve ease and productivity of the inspection process. A test circuit formed in an inner portion of a semiconductor through the DFT process may be used to detect failure of the driver integrated circuit 205 and the film type package, and to verify operational performance of the driver integrated circuit 205 and associated connection pads (221, 222) and signal lines (211, 212).

A test circuit employed in the present example embodiment may include a plurality of test pads 223 disposed on the margin area MA adjacent to the one side of each of the package area PA of the base film 201, and a plurality of test lines 213 connecting the driver integrated circuit 205 and the plurality of test pads 223, respectively. The test pad 223 may have a width wider than a width of the test line 213 to secure a contact area.

As such, the first connection pads 211 may be located in the package area PA, while the plurality of test pads 223 may be located in the margin area MA adjacent to the one side of the package area PA.

In FIG. 2, an area A in which a first connection pad 221 and a test pad 223 are arranged in a film type package may be enlarged and illustrated.

Referring to FIG. 2, a plurality of test lines 213 may alternately arranged with a plurality of first signal lines 211. Although the test lines 213 and the first signal lines 211 employed in the present example embodiment are illustrated as having a 1:1 alternating arrangement, the present disclosure is not limited thereto, and may be implemented in a different number of alternating arrangements.

The plurality of test lines 213 may have a width Wb narrower than a width W1 of the first connection pad 221. The width Wb of the test line 213 may be narrower than a width Wa of the test pad 223. Therefore, the degree of tolerance in designing of an OLB area may be increased by arranging the connection pads 221 side by side with the test lines 213 having a relatively narrow width Wb, as in the present example embodiment, compared to by arranging the test pad 223 with the first connection pad 221.

Further, in a situation in which the final product specification becomes smaller, an OLB area itself required for a display module may be reduced by disposing the test pad 223 only for IC testing in the margin area MA.

The test of the driver integrated circuit 205 may be performed by connecting a probe PR to the test pads 223 disposed in the margin area MA, before being cut into the package unit.

In this manner, the OLB area only for IC testing may be significantly reduced in view of assembly of display modules even while maintaining the test screening ability applied at the time of shipment. Specifically, the degree of tolerance in designing the first connection pad and the first signal line may be increased even in a limited space. For example, the first connection pads 221 and the first signal lines 211 in the package area PA are not sharing valuable film area with the test pads 223, because the test pads 223 are located in the margin area MA. The margin area MA will be cut away at the cutting line CL some time after performance of tests using the test pads 223.

As illustrated in FIG. 2, a portion of the test line 213 may extend to the margin area MA to be connected to the test pad 223 located in the margin area MA.

In the present example embodiment, the test line 213 and the first connection pad 221 are illustrated as being arranged side by side to have a constant interval d therebetween. However, in another example embodiment, it may be variously changed to be widened in a direction in which an interval between the test line and the first connection pad extends (See FIGS. 8 and 9).

Referring to FIG. 1, the film type package 200 may include a plurality of sprocket holes 220 formed in areas of both end located in a second direction (X2, i.e., a width direction) of the base film 201. The sprocket holes 220 may be used to fix the film type package 200 to a predetermined position, or to perform operations such as winding, in manufacturing and handling operations of the film type package 200.

In the present example embodiment, the film type package 200 may be provided as a package unit 200A that is cut based on a cutting line CL and used for module assembly. In such a cutting process, the test pads 223 used for IC testing in a shipping process may be removed together with the margin area MA from the final package unit 200A. Further, the sprocket holes 220 may be cut with reference to the cutting line CL, and may be removed together with the margin area MA in the final package unit 200A. The disposition of the test pads 223 in the margin area MA outside the cutting line CL allows for probing of the DIC 205 while not burdening the final cut-away package unit 200A with the area needed for the test pads 223.

Figure 3:
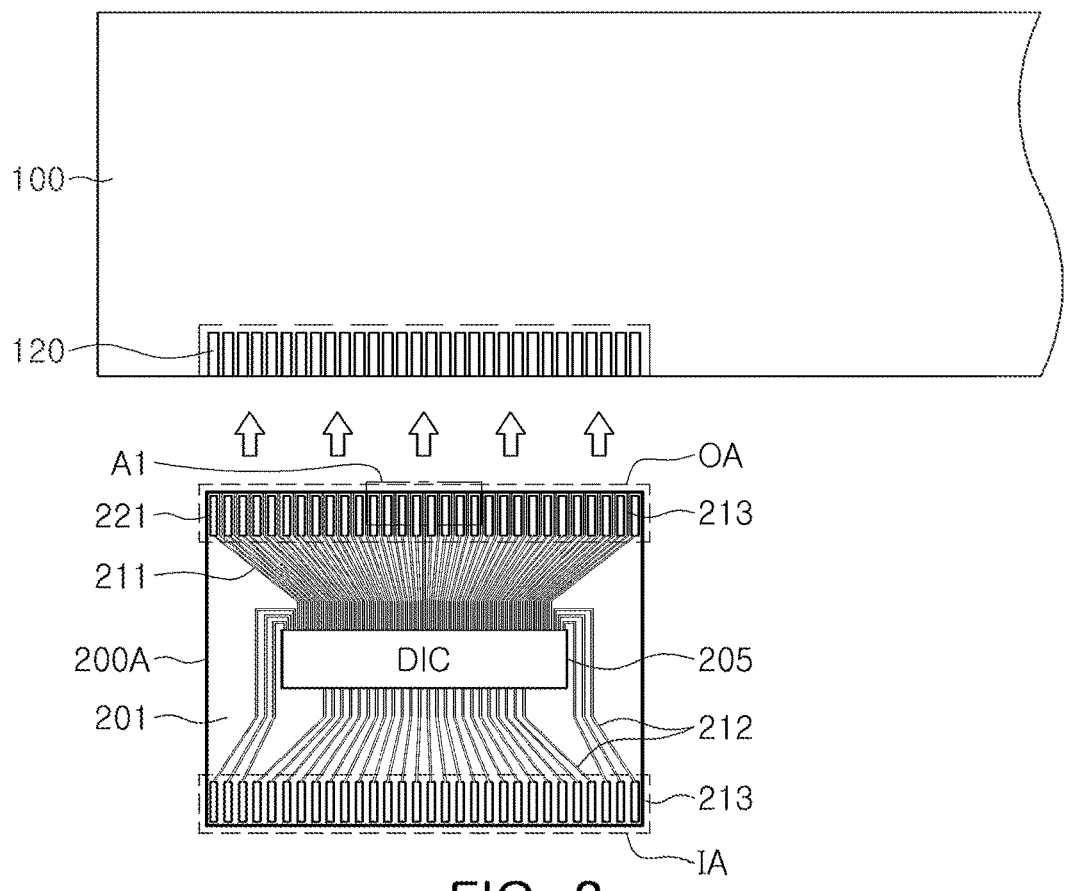
FIG. 3 is a plan view illustrating a joining process of a film type package and a printed circuit board.
Figure 4:
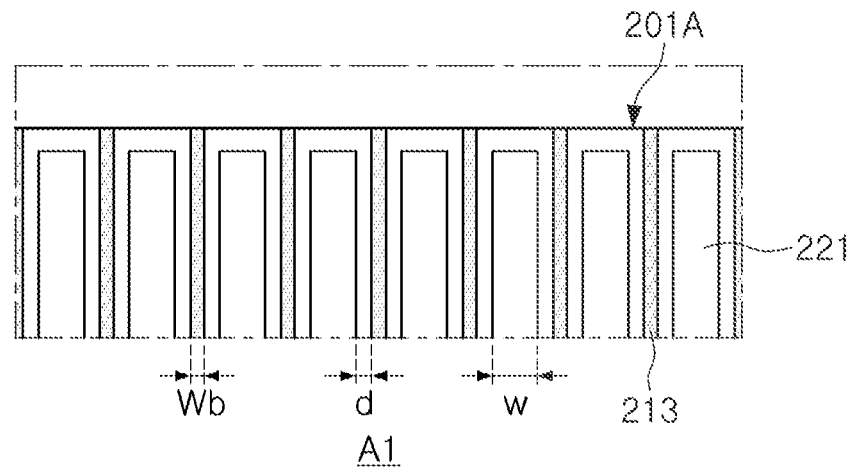
FIG. 4 is an enlarged plan view of an area A1 in a film type package illustrated in FIG. 3.

FIG. 3 is a plan view illustrating a joining process of a film type package and a printed circuit board, and FIG. 4 is an enlarged plan view of an area A1 in a film type package illustrated in FIG. 3.

A package unit 200A illustrated in FIG. 3 can be understood as an individual film type package obtained from a reel type film type package 200 illustrated in FIG. 1. First connection pads 221 to be connected to a printed circuit board 100 without a test pad 223 may be only disposed on an area adjacent to one side of the package unit 200A (hereinafter, also referred to as a "film type package" in view of assembly of modules), i.e., an OLB area (OA). The first connection pads 221 of the OLB area (OA) may be smoothly assembled with a plurality of connection pads 120 of the printed circuit board 100.

Referring to FIGS. 3 and 4, a film type package 200A may include a base film 201 having a first side 201A and a second side 201B opposing each other. Test lines 213 may extend to the first side 201A adjacent to an OLB area (OA), while first connection pads 221 may be spaced apart from the first side 201A, and disposed in an OLB area (OA).

As described above, in the OLB area (OA), the test lines 213 may be easily distinguished from the first connection pads 221 in view of the fact that the test lines 213 may extend to the first side 201A, in addition to the fact that the test lines 213 may have a width narrower than a width of the first connection pads 221.

Referring to FIG. 3, the plurality of connection pads 120 of the printed circuit board 100 may be configured to be connected to the plurality of first connection pads 221 located in the OLB area OA of the film type package 200A. The printed circuit board 100 employed in the present example embodiment may be a flexible PCB (F-PCB) having ductility.

Figure 5:
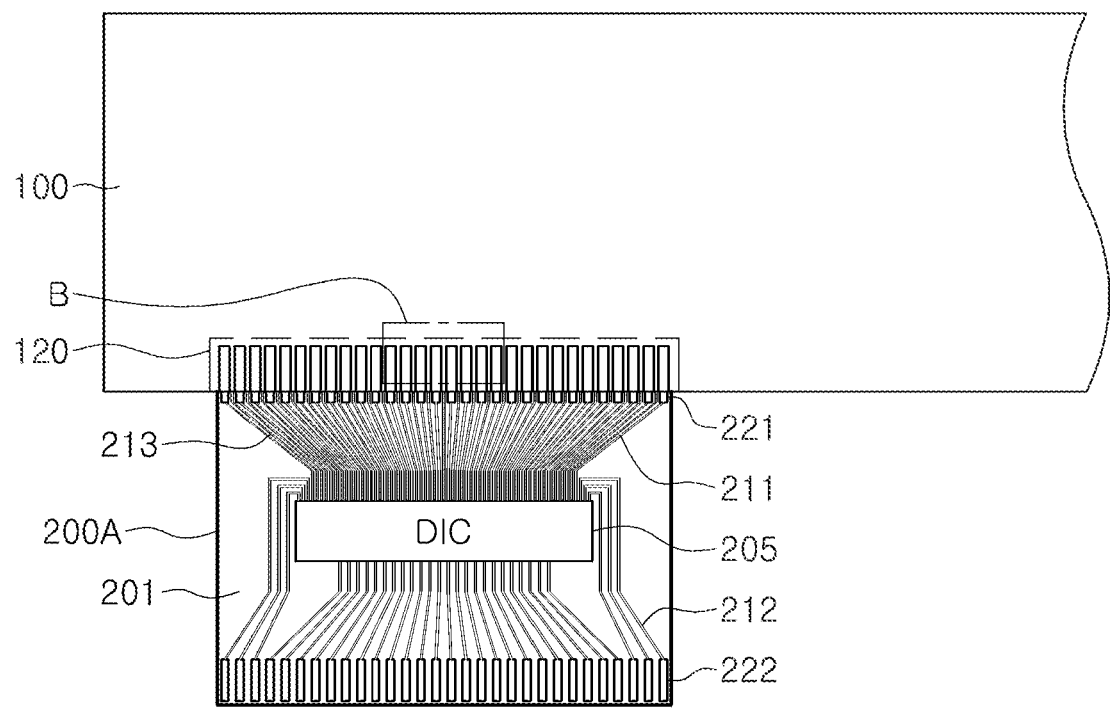
FIG. 5 is a plan view illustrating a state in which a film type package and a printed circuit board are joined together.
Figure 6:
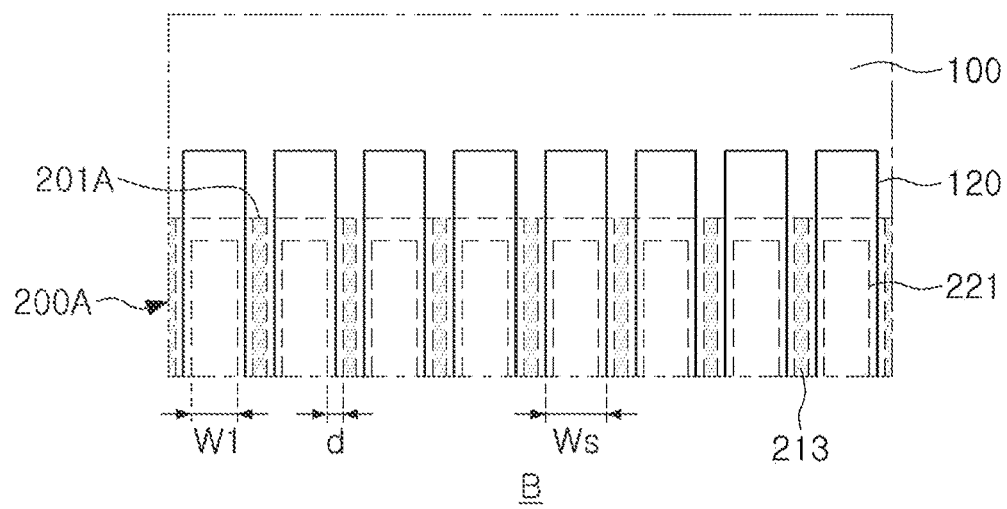
FIG. 6 is an enlarged plan view of an area B in an assembly illustrated in FIG. 5.

FIG. 5 is a plan view illustrating a state in which a film type package and a printed circuit board are joined together, and FIG. 6 is an enlarged plan view of an area B in an assembly illustrated in FIG. 5.

Referring to FIGS. 5 and 6, an area of a plurality of connection pads 120 of a printed circuit board 100 and an OLB area OA of a film type package 200A may be arranged to overlap with each other, and the plurality of connection pads 120 and a plurality of first connection pads 221 may be joined to be connected to each other, respectively.

The connection pads 120 of the printed circuit board 100 and the first connection pads 221 of the film type package 200A may be bonded using an anisotropic conductive film (ACF). The anisotropic conductive film may be similar to a double-sided tape. When a pressure with a high temperature is applied to an area in which the anisotropic conductive film is formed using a Hot Bar, materials to be joined may be melted. As a result, the connection pads 120 of the printed circuit board 100 and the first connection pads 221 of the film type package 200A may be electrically/mechanically connected to each other, respectively.

In the present example embodiment, the connection pads 120 of the printed circuit board 100 may be connected to only the first connection pads 221 to be desired, and not be connected to the test lines 213 adjacent thereto, at the same time. A width Ws of the connection pad 120 of the printed circuit board 100 may satisfy $W1 \leq Ws \leq W1+2d$, where d is an interval between the plurality of first connection pads 221 and the test lines 213 adjacent thereto, to promote such a connection.

Figure 12:
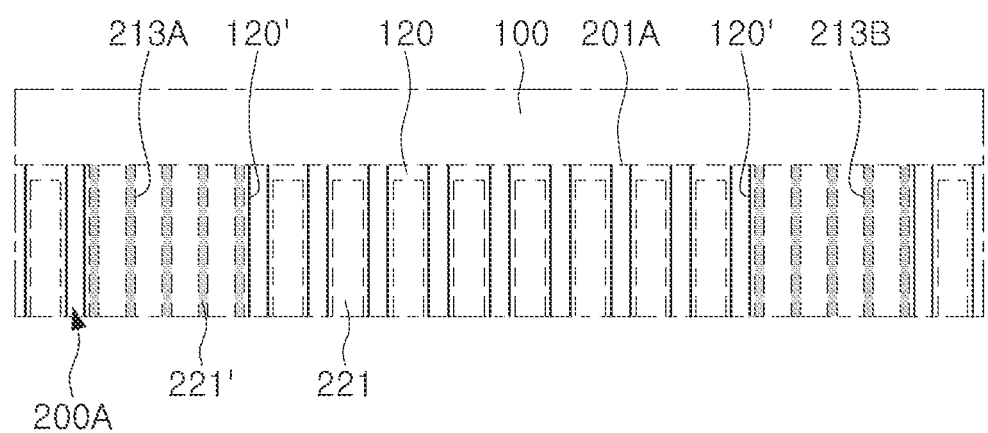
FIG. 12 is a plan view illustrating a state in which a film type package and a printed circuit board illustrated in FIG. 10 are joined together.

In the present example embodiment, the plurality of first connection pads 221 may be arranged alternately with the plurality of test lines 213, and, when the first connection pads 221 have an arrangement different from the above, the connection pads 120 of the printed circuit board 100 may be designed in different forms (see FIG. 12).

Figure 7:
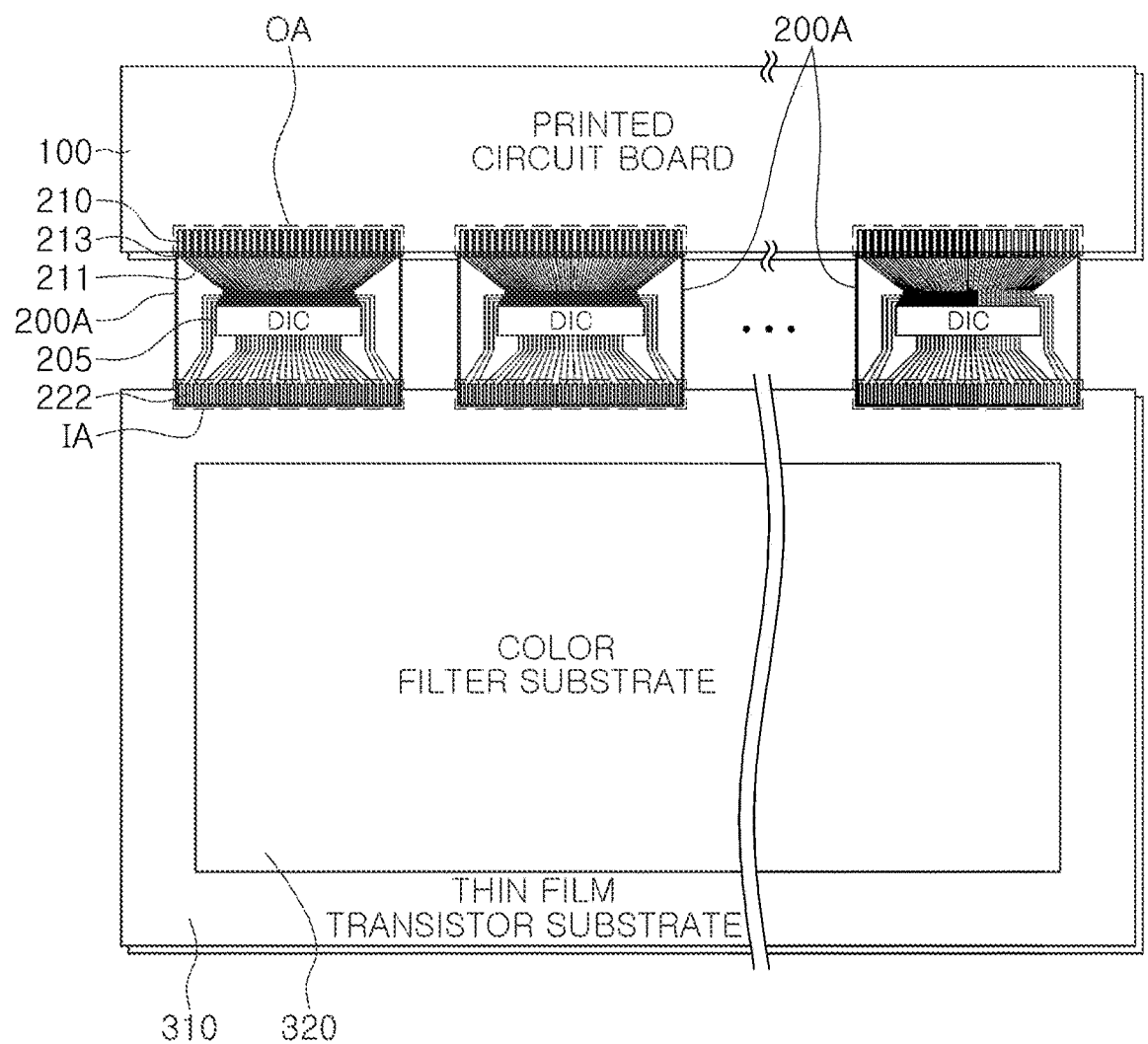
FIG. 7 is a plan view illustrating a display apparatus having a film type package illustrated in FIG. 3.

FIG. 7 is a plan view illustrating a display apparatus having a film type package illustrated in FIG. 3.

Referring to FIG. 7, a display apparatus may include a printed circuit board 100, a display panel 300, and a plurality of film type packages 200A connected between the printed circuit board 100 and the display panel 300.

The plurality of film type packages 200A may be electrically connected to connection pads 120 of the printed circuit board 100 through first connection pads 211 located in an OLB area (OA), as described above. In a similar manner to the above, second connection pads 212 located in an ILB area (IA) may be electrically connected to the display panel 300. A bonding of second connection pads 212 of the film type package 200A and the display panel 300 may be implemented by using an anisotropic conductive film, similar to the bonding of the connection pads 120 of the printed circuit board 100.

Various components, such as a controller and a driving voltage generator, may be mounted on the printed circuit board 100. For example, a controller of the printed circuit board 100 may be configured to output a control signal, and a driving voltage generator may be configured to output voltages required for operation of the display apparatus (e.g., power supply voltage, gate-on voltage, gate-off voltage, and the like).

The display panel 300 employed in the present example embodiment may be a liquid crystal display panel. The display panel 300 may include a thin film transistor substrate 310, a color filter substrate 320, and a liquid crystal. The thin film transistor substrate 310 may include tens to millions of thin film transistors arranged in a matrix form on a glass substrate.

The ILB area (IA) of the film type package 200A may be joined to the thin film transistor substrate 310. The color filter substrate 320 may be opposed to the thin film transistor substrate 310, and may include red (R), green (G), and blue (B) pixels that exhibit color, when light generated by a backlight passes through the color filter substrate 320. Liquid crystal may be injected between the thin film transistor substrate 310 and the color filter substrate 320. Transmittance of light may be controlled by intensity of electric field formed between a pixel electrode and a common electrode. In this way, a desired image may be displayed on the display panel 300.

A tested driver integrated circuit 205 of the film type package 200A is obtained by removal of the test pads 223, after the test pads 223 have been used in an inspection by a probe in a cutting (individualizing) process (see cutting line CL in FIGS. 1 and 2). The cutting process is performed after the test process is performed in a reel-type illustrated in FIG. 1. The cutting process is performed before shipment, together with removal of a margin area MA. Therefore, only a portion of test lines among test circuits may remain in an OLB area (OA) of a film type package 200A (see FIGS. 4, 6, 11, and 12) employed in a display apparatus illustrated in FIG. 7.

The test circuits, i.e., the test lines and the test pads, may be formed in various arrangements. The first connection pads of the OLB area may be disposed in various designs, and according to this arrangement, an arrangement of the connection pad of the printed circuit board may also be changed appropriately.

Figure 8:
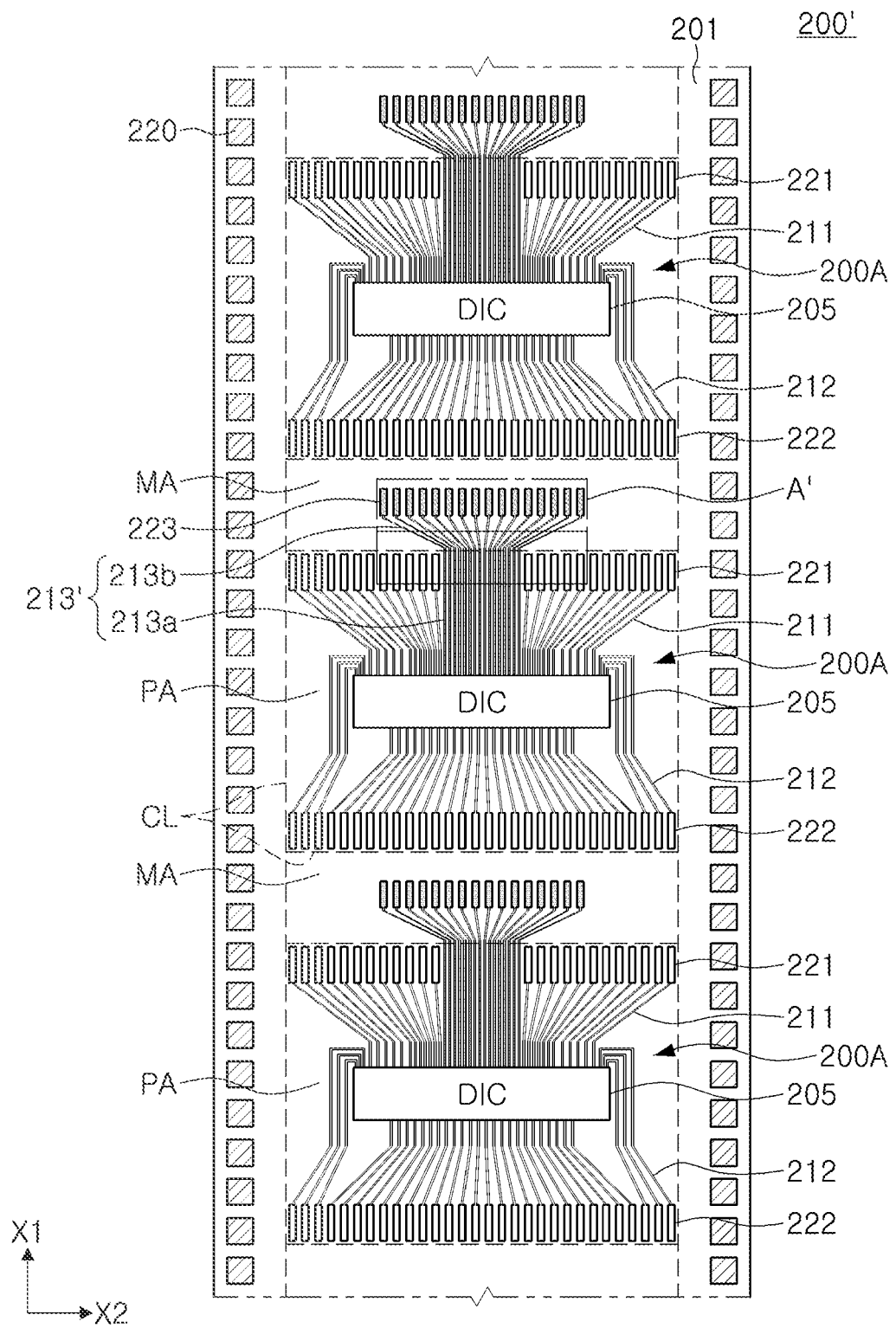
FIG. 8 is a plan view illustrating a film type package according to an example embodiment.
Figure 9:
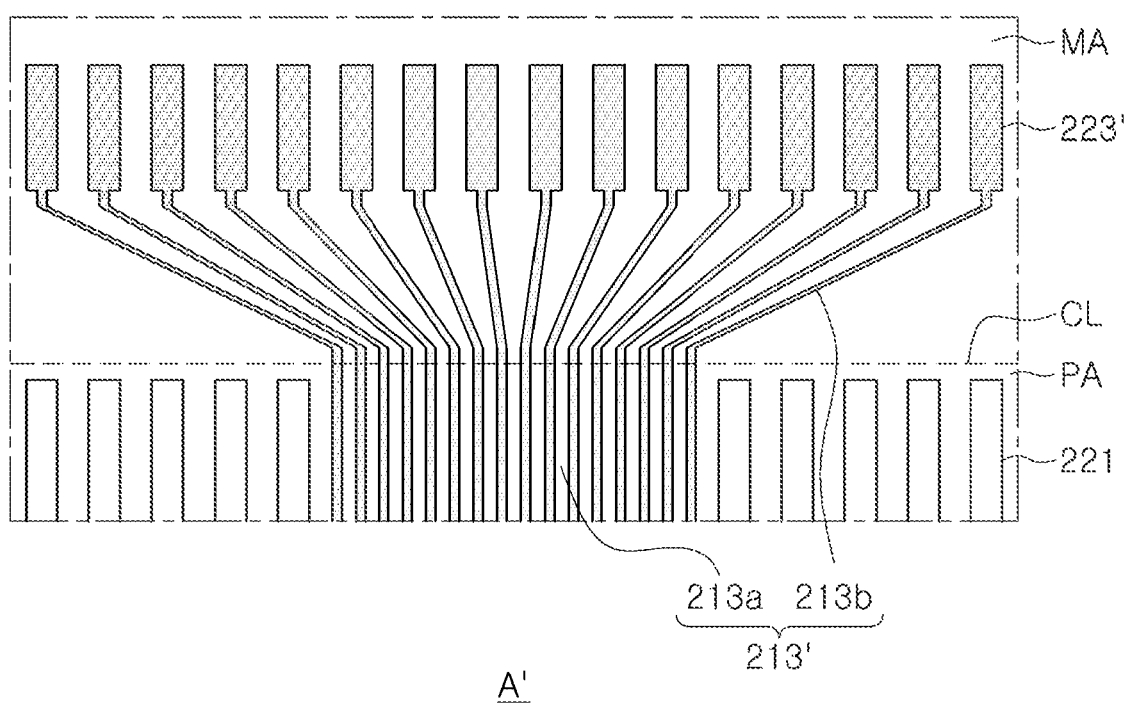
FIG. 9 is an enlarged plan view of an area A' of a film type package illustrated in FIG. 8.

FIG. 8 is a plan view illustrating a film type package according to an example embodiment, and FIG. 9 is an enlarged plan view of an area A' of a film type package illustrated in FIG. 8.

Referring to FIGS. 8 and 9, a film type package 200' according to the present example embodiment can be understood as being similar to a film type package 200 illustrated in FIGS. 1 and 2, except that a plurality of first connection pads 221 may be divided into two groups, and a plurality of test lines 213' may be disposed between the first connection pads 221 of the two groups. The description of the components of the present example embodiment may be referred to the description of the same or similar components of a film type package 200 illustrated in FIGS. 1 and 2, unless specifically explained otherwise.

In the present example embodiment, the plurality of first connection pads 221 may be divided into two groups, and the plurality of test lines 213' may be disposed between the first connection pads 221 of the two groups. The plurality of test lines 213' may be disposed substantially at a center of the base film 201 in a width direction (an X2 direction).

The plurality of test lines 213' may include a first portion 213a located in a package area PA and a second portion 213b located in a margin area MA. As illustrated in FIG. 9, the first portion 213a located in the package area PA may be disposed to have a substantially constant interval, and the second portion 213b located in the margin area MA may be disposed to have an increasing interval toward the plurality of test pads 223'.

As described above, in the margin area MA, the plurality of test lines 213' may be disposed to be unfolded, such that the test pads 223' may be formed to have sufficient interval and/or area. In some example embodiments, as the test lines 213" cross the base film from the DIC 205 in the package area PA to the margin area MA, the test lines 213' begin to fan out after crossing the cutting line CL.

Figure 10:
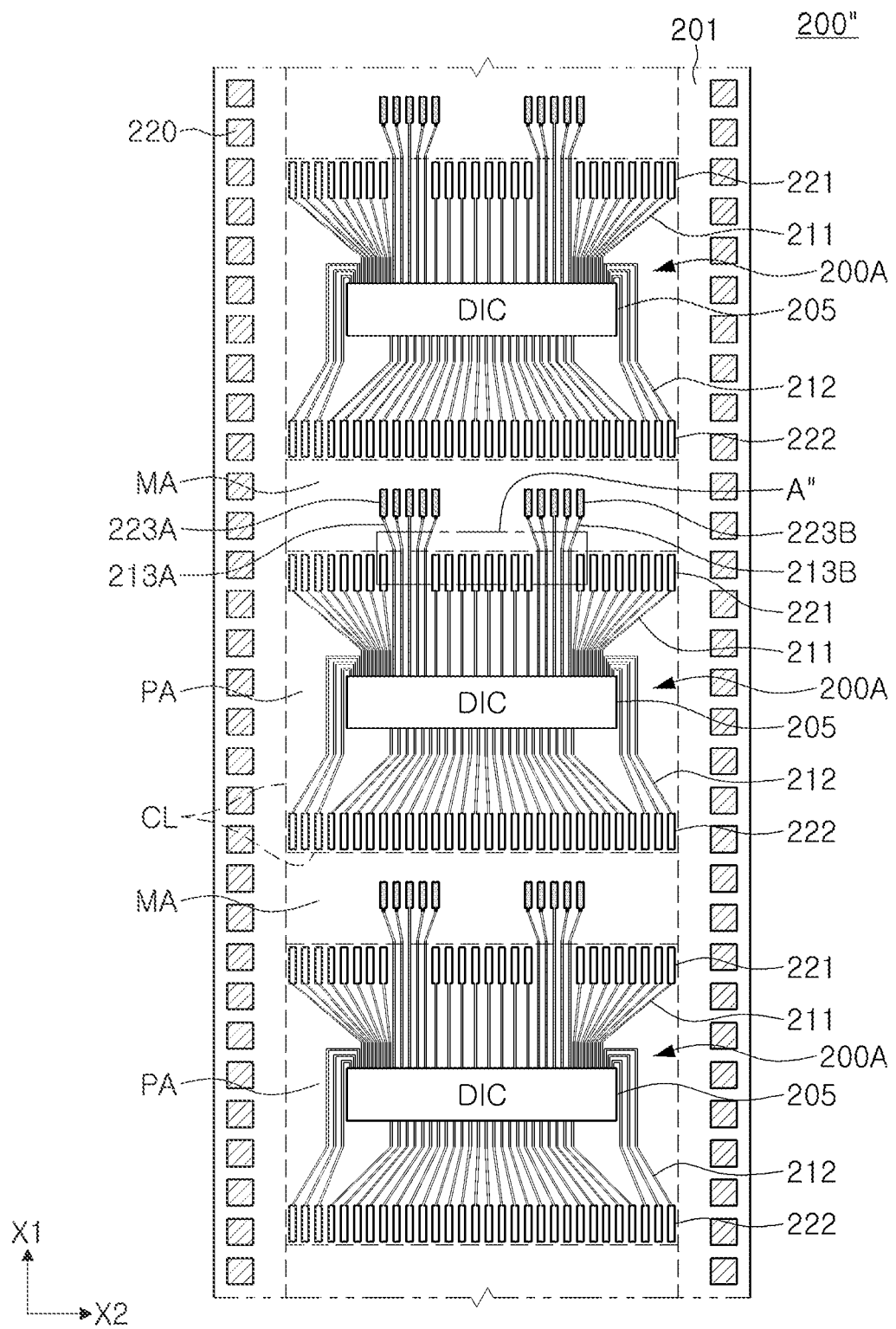
FIG. 10 is a plan view illustrating a film type package according to an example embodiment.
Figure 11:
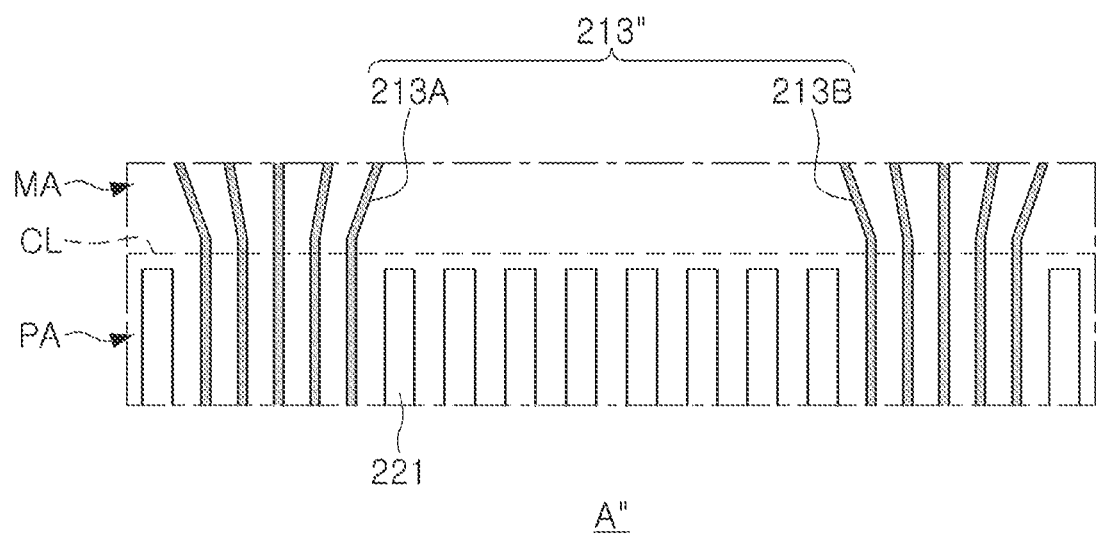
FIG. 11 is an enlarged plan view of an area A" of a film type package illustrated in FIG. 10.

FIG. 10 is a plan view illustrating a film type package according to an example embodiment, and FIG. 11 is an enlarged plan view of an area A" of a film type package illustrated in FIG. 10.

Referring to FIGS. 10 and 11, a film type package 200" according to the present example embodiment can be understood as being similar to a film type package 200 illustrated in FIGS. 1 and 2, except that a plurality of test lines 213" may be divided into two groups 213A and 213B, and eight (8) first connection pads 221 may be disposed between the two groups of test lines 213A and 213B. The two group of test lines 213A and 213B may be connected to two groups of test pads 223A and 223B, respectively. The description of the components of the present example embodiment may be referred to the description of the same or similar components of a film type package 200 illustrated in FIGS. 1 and 2, unless specifically explained otherwise.

In a different manner to the present example embodiment, the plurality of test lines 213" may be divided into three or more groups, and the first connection pad 221 located between the test lines 213" may also be arranged in different numbers.

As described above, the plurality of test lines may be divided into a plurality of groups each including m (m≥2) of the test lines, and the test lines of the plurality of groups may be disposed with n (n≥2) of the first connection pads therebetween.

FIG. 12 is a plan view illustrating a state in which a film type package 200A and a printed circuit board 100 illustrated in FIG. 10 are joined together. A junction illustrated in FIG. 12 can be understood with reference to the junction related explanation described in the previous example embodiment (see FIG. 6).

A printed circuit board 100 employed in the present example embodiment may include a dummy pad 120' together with a connection pad 120. The connection pad 120 of the printed circuit board 100 may be bonded correspondingly to a first connection pad 221 of a film type package 200A, similarly to the previous example embodiment.

The dummy pads 120' of the printed circuit board 100 may be arranged to correspond to test lines 213 of each group. The dummy pad 120' may not be connected to a functional circuit of the printed circuit board 100, or may be connected to a ground pattern. The dummy pads 120' employed in this example embodiment may have an area covering the test lines 213A and 213B of each group, and may be bonded to the printed circuit board 100, and a stable connection of the film type package 200A may be ensured through the bonding with the dummy pad 120'.

According to the present example embodiment, the OLB area only for IC testing in view of assembly of display modules may be significantly reduced without lowering the test screening ability applied at the time of shipment. In particular, the degree of tolerance in designing test lines and signal lines may be increased, while reducing significantly spatial constraints in a limited width.

The various and advantageous advantages and effects of the present disclosure are not limited to the above description.

While example embodiments have been shown and described above, it will be apparent to those skilled in the art that modifications and variations could be made without departing from the scope of the present disclosure as defined by the appended claims.

What is claimed is:

1. A film type package comprising:
    a base film having a first side and a second side opposite to the first side;
    a driver integrated circuit mounted on the base film;
    a plurality of first connection pads disposed on a first area of the base film that is adjacent to the first side of the base film, and configured to be connected to a first external circuit;
    a plurality of second connection pads disposed on a second area of the base film that is adjacent to the second side of the base film, and configured to be connected to a second external circuit;

a plurality of first signal lines disposed on the base film, and connecting the driver integrated circuit and the plurality of first connection pads;

a plurality of second signal lines disposed on the base film, and connecting the driver integrated circuit and the plurality of second connection pads; and a plurality of test lines disposed on the base film and extending from the driver integrated circuit to the first side of the base film, wherein the plurality of test lines are divided into a plurality of groups of at least two test lines, and the plurality of groups of at least two test lines are arranged with at least two of the plurality of first connection pads disposed therebetween.

2. The film type package according to claim 1, wherein the plurality of test lines have a first width that is narrower than a second width of the plurality of first connection pads.

3. The film type package according to claim 2, wherein the plurality of first connection pads are disposed at a constant interval.

4. The film type package according to claim 2, wherein the plurality of test lines extend, with a constant width, from the driver integrated circuit to the first side of the base film.

5. The film type package according to claim 1, wherein the at least two test lines are disposed at substantially constant intervals in an area overlapping the plurality of first connection pads in a width direction of the base film.

6. A display apparatus comprising:

at least one film type package comprising a base film having a first side and a second side opposite to the first side;

a printed circuit board connected to the at least one film type package at the first side of the base film; and a display panel connected to the at least one film type package at the second side of the base film, wherein the at least one film type package comprises:

a driver integrated circuit mounted on the base film;

a plurality of first connection pads disposed on a first area of the base film that is adjacent to the first side of the base film, and configured to be connected to the printed circuit board;

a plurality of second connection pads disposed on a second area of the base film that is adjacent to the second side of the base film, and configured to be connected to the display panel;

a plurality of first signal lines disposed on the base film, and connecting the driver integrated circuit and the plurality of first connection pads;

a plurality of second signal lines disposed on the base film, and connecting the driver integrated circuit and the plurality of second connection pads; and a plurality of test lines extending from the driver integrated circuit to the first side of the base film, each of the plurality of test lines having a width Wb that is narrower than a width W1 of each of the plurality of first connection pads, wherein the printed circuit board comprises a plurality of connection pads bonded to the plurality of first connection pads of the at least one film type package, wherein the plurality of first connection pads are alternately arranged with the plurality of test lines, and wherein a width Ws of each of the plurality of connection pads of the printed circuit board is greater than the width W1 of each of the plurality of first connection pads and the width Ws of each of the plurality of connection pads of the printed circuit board is sufficiently narrow to not overlap any test line adjacent to each of the plurality of first connection pads, such that $W1 \leq Ws \leq W1+2d$, where d is a distance from one of the plurality of first connection pads to an adjacent test line.

7. The display apparatus according to claim 6, wherein the printed circuit board further comprises a dummy pad connected to at least one of the plurality of test lines.

8. A display apparatus comprising:

at least one film type package comprising a base film having a first side and a second side opposite to the first side;

a printed circuit board connected to the at least one film type package at the first side of the base film; and a display panel connected to the at least one film type package at the second side of the base film, wherein the at least one film type package comprises:

a driver integrated circuit mounted on the base film;

a plurality of first connection pads disposed on a first area of the base film that is adjacent to the first side of the base film, and configured to be connected to the printed circuit board;

a plurality of second connection pads disposed on a second area of the base film that is adjacent to the second side of the base film, and configured to be connected to the display panel;

a plurality of first signal lines disposed on the base film, and connecting the driver integrated circuit and the plurality of first connection pads;

a plurality of second signal lines disposed on the base film, and connecting the driver integrated circuit and the plurality of second connection pads; and a plurality of test lines extending from the driver integrated circuit to the first side of the base film, wherein the printed circuit board comprises a plurality of connection pads bonded to the plurality of first connection pads of the at least one film type package, and wherein the plurality of test lines are divided into a plurality of groups of at least two test lines, and the plurality of groups of at least two test lines are arranged with at least two of the plurality of first connection pads disposed therebetween.

* * * * *